United States Patent
Haga et al.

[11] Patent Number: 5,283,207
[45] Date of Patent: Feb. 1, 1994

[54] PHOTOCONDUCTIVE MATERIAL AND PHOTOSENSOR EMPLOYING THE PHOTOCONDUCTIVE MATERIAL

[75] Inventors: Koichi Haga, Matsugagoshi; Masafumi Kumano, Sendai, both of Japan

[73] Assignees: Ricoh Company, Ltd., Tokyo; Ricoh Research Institute of General Electronics Co., Ltd., Natori, both of Japan

[21] Appl. No.: 896,587

[22] Filed: Jun. 10, 1992

Related U.S. Application Data

[62] Division of Ser. No. 635,210, Dec. 28, 1990, Pat. No. 5,155,567.

[30] Foreign Application Priority Data

Jan. 17, 1990 [JP] Japan ................... 2-7646
Sep. 5, 1990 [JP] Japan ................. 2-234747

[51] Int. Cl.$^5$ ........................... H01L 31/18
[52] U.S. Cl. ......................... 437/101; 437/3; 437/101; 148/DIG. 1
[58] Field of Search ............. 437/2, 3, 101, 904; 148/DIG. 1

[56] References Cited

U.S. PATENT DOCUMENTS

| | | | |
|---|---|---|---|
| 4,357,179 | 11/1982 | Adams et al. | 437/101 |
| 4,460,670 | 7/1984 | Ogawa et al. | 357/2 X |
| 4,517,223 | 5/1985 | Ovshinsky et al. | 437/101 |
| 4,857,115 | 8/1989 | Iwamoto et al. | |

FOREIGN PATENT DOCUMENTS

| | | |
|---|---|---|
| 0053402 | 6/1982 | European Pat. Off. |
| 0070509 | 1/1983 | European Pat. Off. |
| 0221523 | 5/1987 | European Pat. Off. |
| 0309000 | 3/1989 | European Pat. Off. |
| 3135412 | 8/1982 | Fed. Rep. of Germany |
| 3244626 | 6/1983 | Fed. Rep. of Germany |
| 3732617 | 4/1988 | Fed. Rep. of Germany |
| 3742110 | 6/1988 | Fed. Rep. of Germany |
| 83011865 | 5/1983 | PCT Int'l Appl. ............. 437/101 |

OTHER PUBLICATIONS

Morimoto et al, "Structure and Defects in Amorphous Si–O Films," *Japanese Journal of Applied Physics*, vol. 26, No. 1, Jan. 1987, pp. 22–27.

Tsu et al, "Effects of the Nearest Neighbors and the Alloys Matrix on SiH Stretching Vibrations in the Amorphous SiOr:H" ($0<\gamma<2$).

Comber et al, "The Effect of Preparation Conditions and of Oxygen and Hydrogen on the Properties of Amorphous Silicon," Proceedings of the Fifth International Conference on Amorphius and Liquid Semiconductors, Sep. 3–8, 1973, pp. 245–250.

Appl. Phys. Lett., vol. 52, No. 10, pp. 807–809, Mar. 7, 1988, T. L. Chu, et al., "Reduced Photoinduced Degradation in Chemical Vapor Deposited Hydrogenated Amorphous Silicon Films".

Journal of Applied Physics, vol. 65, No. 6, pp. 2439–2443, Mar. 15, 1989, A. Asano, et al., "Preparation of Highly Photoconductive Hydrogenated Amorphous Silicon Carbide Films with a Multiplasma-Zone Apparatus".

*Primary Examiner*—Olik Chaudhuri
*Assistant Examiner*—Ramamohan Rao Paladugu
*Attorney, Agent, or Firm*—Oblon, Spivak, McClelland, Maier & Neustadt

[57] ABSTRACT

A photoconductive material comprises a photocarrier generating zone using a wide-band gap material and a photocarrier moving zone using an amorphous silicon material. A photocarrier generating zone including a silicon atom as a principal atom comprises an amorphous silicon which contains at least one kind of atom selected from a group including oxygen, nitrogen and carbon and also contains an atom which terminates a dangling bond of a silicon. This photoconductive material can be used for various devices because of its wideband gap and high photosensitivity.

8 Claims, 3 Drawing Sheets

PHOTOCONDUCTIVE MATERIAL AND PHOTOSENSOR EMPLOYING THE PHOTOCONDUCTIVE MATERIAL This is a division of application Ser. No. 07/635,210, filed on Dec. 28, 1990, now U.S. Pat. No. 5,155,567.

BACKGROUND OF THE INVENTION

This invention relates to a photoconductive material for use in photosensitive drums of copiers and printers, photosensors, solar cells and thin film transistors. More specifically, this invention relates to a photoconductive structure comprising a carrier generating region of a wide band gap material scattered in an amorphous silicon material.

Conventionally, hydrogen or fluorine has been used in the amorphous silicon to reduce the state density that is formed in the forbidden band in the vicinity of the conduction band and the valence band by terminating the dangling bond of silicon. Such a termination of the dangling bond results in a high photosensitivity of the amorphous silicon devices and also enables the doping of the amorphous silicon to any of P- and N-types. The amorphous silicon thus obtained are used to develop various devices and attempts have been made to apply these materials to sensors, solar cells, photosensitive fields and other devices.

In recent years, there is a demand of photosensors that have a high sensitivity in the wavelength of visible optical radiation, particularly of the wavelength of blue lights. In consequence, there is an increasing need of the photoconductor having a high photosensitivity and simultaneously a wide band gap.

In many cases, the wide band gap material is formed by incorporating oxygen, nitrogen, carbon etc. into an amorphous silicon matrix. However, while the amorphous silicon photoconductor thus formed has the desirable wide band gap, there is a problem in that the mobility of carriers in the photoconductor tends to decrease due to the incorporated elements that also act as the trap of careers. Therefore, there is a disadvantage that the desired high photosensitivity of such a silicon photoconductor for the short wavelength optical radiation is harmfully reduced due to the decrease in the mobility of the carriers.

SUMMARY OF THE INVENTION

Accordingly, it is a general object of the present invention to provide a novel and useful photoconductor in which the aforementioned problems are eliminated.

A more specific object of the present invention is to provide a photoconductor which has a high photosensitivity and simultaneously a wide band gap while preventing a decrease in the mobility of carriers.

Another object of the present invention is to provide a photoconductor including a photocarrier generating region for producing photocarriers, said photocarrier generating region comprising a wide band gap material and provided as an isolated, island region, and a photocarrier conducting region for transporting the photocarriers that have been produced in the photocarrier generating region, said photocarrier conducting region comprising an amorphous silicon material, wherein the photocarrier generating region and the photocarrier conducting region are separately constructed.

Another object of the present invention is to provide a photoconductor including first region of amorphous silicon that contains at least one of the elements selected from a group essentially consisted of oxygen, nitrogen and carbon, in addition to silicon, and a second region of amorphous silicon that contains an element which terminates the dangling bond of silicon in addition to silicon, said first region being provided as an island-like region, scattered in said second region, with an end of the chemical bond extending from the first region being connected to a silicon atom in said second region.

DETAILED DESCRIPTION

The construction of the photoconductor of the present invention is now described.

The photoconductor of the present invention is composed of a photocarrier generating region that in turn comprises an amorphous material having an increased band gap and a photocarrier conducting region comprising an amorphous silicon material.

The wide band gap material comprises an amorphous phase of silicon in which at least one element selected from a group essentially consisted of oxygen, nitrogen and carbon, and includes hydrogen that terminates the dangling bond of silicon atoms.

Figure 1A:
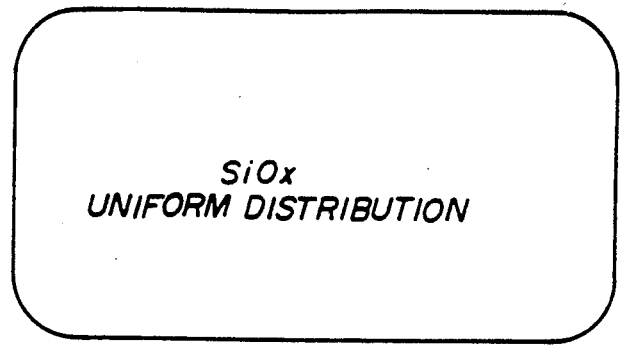
FIGS. 1(A)–1(D) are diagrams showing the microscopic structure of four types of photoconductors.
Figure 1B:
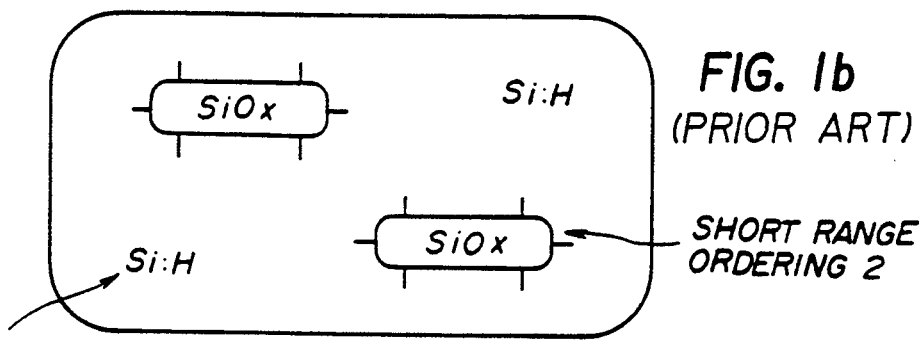
Figure 1C:
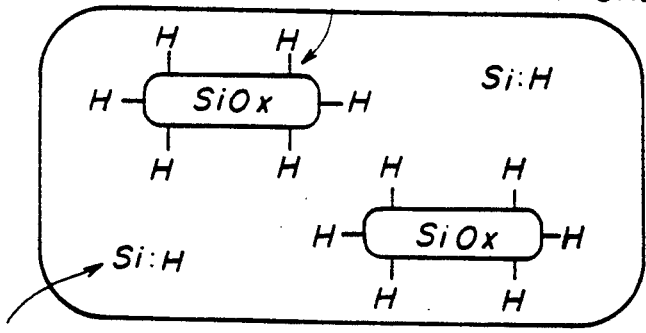
Figure 1D:
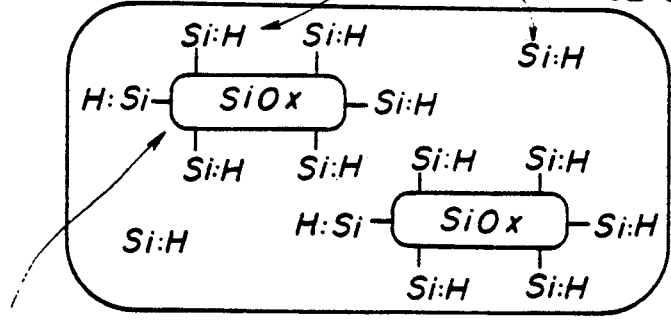

FIGS. 1(B)–1(D) show the microscopic structure of the photoconductor according to the present invention.

Referring to the drawings, the photocarrier generating region comprises a cluster of oxygen, nitrogen or carbon formed in the amorphous phase of silicon, and is designated schematically as a short range ordering region 2.

A photocarrier conducting region comprises an amorphous phase of silicon that contains the element that terminates the dangling bond of silicon. The photocarrier conducting region is designated as a short range ordering region 1, in relation to the absence of the oxygen cluster.

Preferably, the short range ordering regions 1 and 2 are distributed with the ratio H of 0.1–60.

The size of the short range ordering region 2 is preferably 100 Å–100 μm.

Further, the region of the short range ordering 1 is preferably activated by using a dopant comprising group III or V atoms which form a tetrahedral coordination.

According to the construction of the present invention, the carriers that are produced in the photocarrier generating region are transported through the photocarrier conducting region which conducts the photocarriers with excellent mobility. Normally, these photocarrier generating regions and photocarrier conducting regions are distributed at random, although the present invention is not limited to this situation.

Generally, the amorphous silicon material forming the photocarrier conducting region is manufactured through a sputtering method, plasma CVD method, etc. In the plasma CVD method, for example, gaseous sources such as $SiH_4$ and $H_2$ are used. In some cases, the carrier conducting region may create a small amount of photocarriers. However, the manufacturing methods are not affected by this operation.

Four types can be envisaged for the microscopic arrangement of the wide band gap material that forms the photocarrier generating region as shown in FIGS. 1(A) -1(D). In the present invention, the microscopic arrangement shown in FIG. 1(D) is used. Assuming that oxygen atoms are the additives for achieving the wide band gap, the manufacture of the wide band gap material generally involves the use of a source that contains $O_2$ as well as $SiH_4$ and $H_2$.

Referring to the microscopic arrangement of the wide band gap material as shown in FIGS. 1(B), 1(C) or 1(D), the dangling bond of silicon in the short range ordering region 1 is terminated by hydrogen, fluorine etc.

FIG. 1(A) shows a conventional construction in which oxygen atoms are uniformly distributed in the silicon network forming the short range ordering region 1 (for example, in the form of glass).

According to FIG. 1(B), there are provided a number of short range ordering regions 2 in which the cluster of oxygen atoms are formed, as an isolated island in the short range ordering region 1. In this example, the network in the short range ordering region 1 and the network in the short range ordering region 2 are not connected with each other. In addition, while the dangling bond of the short range ordering region 1 is terminated, the dangling bond at the boundary of the short range ordering region 2 is not.

According to FIG. 1(C), there are provided a number of short range ordering regions 2 in which the cluster of oxygen atoms are formed. In this example, too, the network of the short range ordering region 1 and the network of the short range ordering region 2 are not connected with each other. On the other hand, the dangling bond at the boundary of the short range ordering region 2 is terminated by hydrogen.

According to FIG. 1(D), there are provided a number of short range ordering regions 2 in which the cluster of oxygen atoms are formed. In this example, the network of the short range ordering region 1 and the network of the short range ordering region 2 are connected with each other, with the dangling bonds inside the short range ordering region 1 and the short range ordering region 2 are both terminated. To terminate the dangling bond inside the short range ordering region 1 and the short range ordering region 2, materials such as hydrogen, deutrium or halogen atoms are preferably used. Further, any elements except oxygen, nitrogen and carbon can be used for terminating the dangling bond.

Conventionally, the structure as shown in FIG. 1(A) has been proposed for the photoconductor having the large band gap. However, while this structure has a desirable wide band gap, the mobility of carriers therein is low. Particularly, it is not possible to obtain high photosensitivity due to the recombination caused by the defects.

The structure as shown in FIG. 1(B) often occurs when $SiH_4$ and $O_2$ gases reacted violently. This structure includes $SiO_2$ particulate which are formed in the amorphous silicon matrix as a result of a direct reaction between those source gases.

The manufacturing method of the structure as shown in FIG. 1(C) comprises the steps of introducing the $SiH_4$ and a source gas that contain $O_2$ separately into a reaction chamber, causing the decomposition of the source of oxygen, reacting the decomposed radicals with the $SiH_4$ gas, and depositing the product to form a film. Although this structure has a higher sensitivity than that of the structure in FIG. 1(B), it is not suitable as photoconductive material because the network of the short range ordering region 2 is not in conformity with the network of the short range ordering region 1.

In this context, the present invention provides the structure as shown in FIG. 1(D). In this structure, the short range ordering region 2 containing oxygen atoms in the network of amorphous silicon serves as the photocarrier generating region, and the short range ordering region 1 containing the network of amorphous silicon serves as a photocarrier conducting region which transports the photocarrier created in the region 1 to an electrode on which an electrical field is applied. With this structure of FIG. 1(D) in which the dangling bonds of the short range ordering region 1 and the short range ordering region 2 are both terminated, the network of the short range ordering region 1 and the network of the short range ordering region 2 are connected with each other in conformity, and the recombination of photocarriers at the discontinuity of both networks can be substantially suppressed.

In the short range ordering region 1 containing silicon, the dangling bond of the silicon network is terminated by hydrogen or fluorite etc. Desirably, hydrogen is used for such termination. Thereby, Si-H bonds predominate in the short range ordering region 1. On the other hand, Si-H bonds do not exist at allow account for less than 1% of all the chemical bonds in the network.

Figure 2:
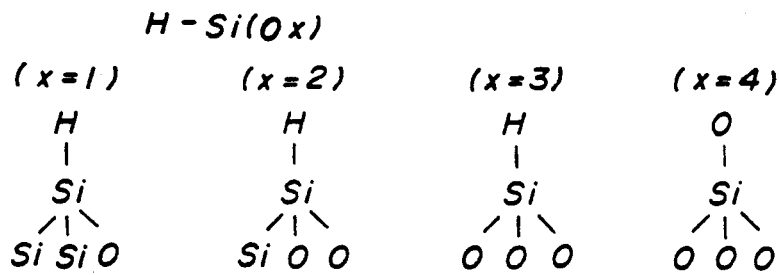
FIG. 2 is a diagram showing the local atomic arrangement formed in a part of the photoconductor of FIGS. 1(B)–1(D)

If hydrogen is used for terminating the dangling bonds of silicon, the short range ordering region 2 that contains the oxygen atoms in the silicon network has the H-Si(Ox) atomic configuration as shown in FIG. 2, wherein x is the number of oxygen atoms contained in the atomic configuration. In this case $0<x<4$. It is important that, in this structure, the bonds extending from the short range ordering region 2 are connected to the network of the amorphous silicon that forms the short range ordering region 1. The dangling bonds of the short range ordering region 2 are desirably less than 0.5% of all the bonds existing therein. The hydrogen atoms that terminate the dangling bonds in the short range ordering region 1 may be contained with the proportion of 2-20 at. %, desirably 5-15 at. %. In the short range ordering region 2 which contains oxygen atoms in the amorphous silicon network, the content of the hydrogen is 5-30 at. %, desirably 7-25 at %. As to the content of oxygen atoms, it is preferably 0.5-65 at. %.

The structure shown in FIG. 1(A) is described in Physical Review B Vol. 140, No. 3, 1975, which reports the result of infrared absorption measurement. This article notices the infrared absorption peak at the wavelength of about 2000 cm$^{-1}$. The absorption peak changes about the wavelength of 2000 cm$^{-1}$ with the value of the parameter x of H-Si(Ox) structure. When x=0, an infrared absorption occurs at the wavelength of 2000 cm$^{-1}$. When x=1, the absorption occurs at 2100 cm$^{-1}$. When x=2 or x=3, it occurs at 2195 cm$^{-1}$ or 2265 cm$^{-1}$ respectively. This article reports that, as the content of oxygen atoms increases, the infrared absorption peak caused by the amorphous silicon is shifter to the shorter wavelength side, thereby demonstrating that the photoconductor has the structure shown in FIG. 1(A). The film according to the present invention, on the other hand, does not show the change in the infrared absorption peak even when there is an increase of the oxygen content. It is estimated, based upon the calculation cited in the above-mentioned article, that the photoconductor of the present invention has the structure of FIG. 1(D). With respect to the structures in FIGS. 1(B) and 1(C), reference should be made to Jpn. J. Appl. Phys. Vol. 26, No. 1, 222 which proves that these structures has low photosensitivity.

Now, the fabricating method of the photoconductor according to the present invention will be described. In the fabrication of the photoconductor of the present invention, the use of the CVD method is desirable. In the present case, unlike the ordinary CVD techniques, the source gases are selected to satisfy a predetermined relationship with respect to the bonding energy.

As the source gas for silicon, the gasses such as $SiH_4$, $SiCl_4$, $SiF_4$, $SiD_4$ etc are preferred. When oxygen is used as the additive to form the wide-band gap, short range ordering region 2, the source of oxygen which react with the source gas of silicon spontaneously, without adding external energy such as plasma energy, is not preferable. It is more preferable that the starting gas of oxygen is decomposed into oxygen and other, by-product molecules. In addition, the byproduct molecules preferably exist as a gaseous state under the vacuum condition. For example, $CO_2$, $N_2$, $SO_2$, etc. can be used as the source of oxygen. Taking $CO_2$ as an example, oxygen is released by the plasma assisted reaction that occurs in the form of CO+O. It should be noted that CO exists in the form of gas. The dissociation energy of C and O is 1075 (KJ/mol) while the dissociation energy of CO and O is 532 (KJ/mol). In this case, the first dissociation energy is thus approximately two times as large as the second dissociation energy.

Thus, it is preferable that the by-product molecules become gaseous under the vacuum condition after the oxygen atoms have been released. It is further preferable that the dissociation energy of these molecules is 1.2–5 times larger than the dissociation energy of oxygen. Same is applicable to $N_2O$ and $SO_2$.

By utilizing the difference between these bonding energies, the parameter for the film deposition by the plasma CVD method is optimized. Thereby, the film having the structure as shown in FIG. 1(D) is obtained as a result of the optimized release of oxygen. The parameters to be optimized for depositing the film include the RF power, substrate temperature, pressure and gas flowrate wherein the most important parameter is the RF power and the pressure. If the RF power is too high, the by-product molecules may be decomposed. Therefore, the RF power has to be controlled such that only oxygen is released. Desirably, the RF power is, in the case of $CO_2$, set larger than the dissociation energy of CO+O yet smaller than the dissociation energy of C+O. This energy can be defined as an intermediate energy. While this intermediate energy varies according to the design of the CVD apparatus and the pressure employed, the present study was made with the RF power of 0.01 W/cm$^3$–1.0 W/cm$^3$. In order to monitor these optimum conditions quantitatively, the CVD apparatus is equipped with a mass spectrometer. In the case of $CO_2$, the mass spectroscopic analysis is made for the species $CO_2$, CO, O and C, and it was found that the gas ratio of CO/$CO_2$ between 5–10 is preferable. When the gas ratio exceeds 10, C starts appearing. Because of this, the experiment was conducted while keeping ;the gas ratio less than 10. The optimum substrate temperature was found to be in the range of 150° C.–300° C. By optimizing these parameters for the CVD process, a film having the structure of FIG. 1(D) is obtained.

In the above description, an example that uses oxygen for achieving the wide band gap material has been shown. However, similar results were obtained by using nitrogen, carbon, or a mixture of at least one of oxygen, nitrogen and carbon.

When nitrogen is used for forming the short range ordering region 2, $NH_3$, $NF_3$ etc. may be used as the source of nitrogen. When carbon is used, $CF_4$, alcohol, etc. will be used as the source of carbon.

The ratio H of the short range ordering region 2 with respect to the short range ordering region 1, that is, the ratio of short range ordering 2/short range ordering 1, is preferably in the range of 0.1–60, more specifically 1–45. This ratio can be obtained by adjusting the $CO_2$/$SiH_4$ ratio, the RF power and the pressure to the optimum value. This ratio may be changed depending on the use of the device that incorporates this film. The larger the ratio is, the more the band gap increases. Further, it should be noted that the short range ordering regions 2 exit at random in the film. Generally, a band gap value of 1.9–6.0 eV is obtained. If the band gap is smaller than 1.9 eV, no effective band gap is formed. On the other hand, if the band gap is larger than 6.0 eV, the photosensitivity may be lost.

The quantitative relationship between the photosensitivity and the band gap of this material is now described. Designating the dark current as Id and the photocurrent caused in response to the irradiation of the Air Mass 1 (AM1; power of 1100 mW/cm$^3$ insolation) as Ip, the Ip/Id ratio has to have the value of 1000 or more, assuming the band gap of 2.0 eV. The microscopic size of the short range ordering region 2 is preferably 100 Å–5 μm, and particularly the size of 500 Å–5 μm is preferable. The size can be changed by changing the substrate temperature and pressure. If this size of the region 2 is too small, the relative proportion of hydrogen atoms which terminate the dangling bond of silicon becomes too large, thereby making the entire film porous. Further, the increasing proportion of Si-H bond causes a decrease of the photosensitivity. Further, if the size of the short range ordering region 2 is too large, small particles may exist in the film, which ;is not preferable from the view point of photosensitivity.

Apart from the photosensitivity, the doping is generally necessary for the amorphous silicon film used in the devices and electronic devices. The structures as shown in FIGS. 1(A), 1(B) and 1(C) include a large amount of dangling bonds and difficult to be doped according to the desired conductivity type. In the structure of FIG.

1(D), on the other hand, the dopant is difficult to be incorporated into the short range ordering region 2. Because of this, doping occurs mainly in the Si:H portion of the short range ordering region 1. For the doping to the N-type, the group V elements such as P, As are used. On the other hand, for the doping to the P-type, the group III elements such as B, Al are used. These elements are contained in the portion of the short range ordering region 1 and activated to release the carriers.

In the fabrication process, gases containing the group III element, for example, $B_2H_6$, $Al(CH_3)_3$, $PH_3$, $AsH_3$ are admixed to the source and introduced into the chamber for the simultaneous doping and deposition.

Figure 7:
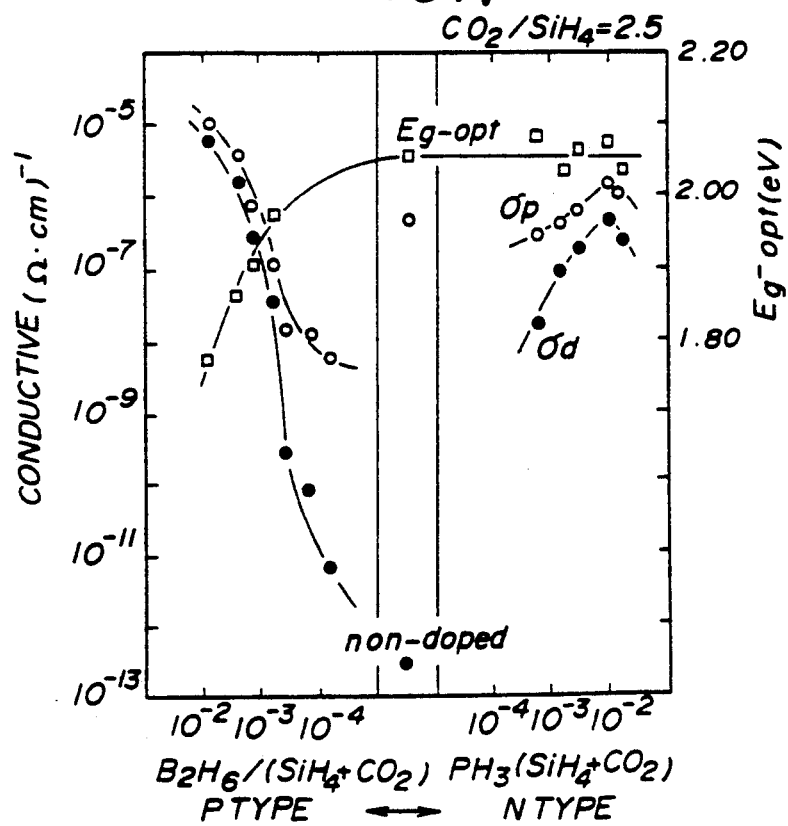
FIG. 7 is a diagram showing the relationship between the relative volume ratio of doping gases and the electric conductivity.

In this way, the doping is achieved mainly on the short range ordering region 2. This region can contain, if necessary, $10^{-6}$–$10^1$ at. % of the group III or V elements. FIG. 7 shows the relationship between the volume ratio of the doping gas of the group III and V elements and the variation of the conductivity caused by the doping. As apparent from the result shown in FIG. 7, the short range ordering region 1 shows the characteristics similar to the conventional a-Si:H film.

It is possible to fabricate various devices utilizing the photoconductor of the present invention. For example, application can be conceived for the photosensitive bodies of copiers and printers, photosensors, solar cells, phototransistor, CCDs, etc. While these devices can be obtained by using the film of the photoconductor, multiple construction of the photoconductor film is also possible.

Figure 3:
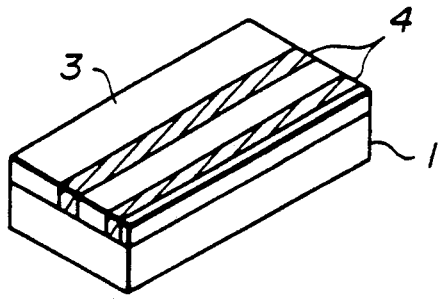
FIG. 3 is a diagram showing the structure of a device in which the photoconductor of the present invention is used, in the perspective view.
Figure 4:
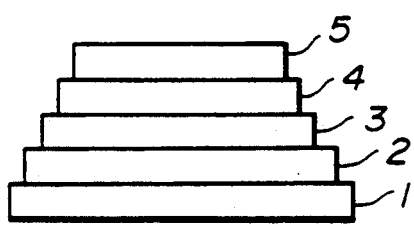
FIG. 4 is a diagram showing the construction of a photosensor wherein the photoconductor of the present invention is used.

The above description has been directed to the structure in which the short range ordering region 2 is scattered as an island in the sea of the short range ordering region 1. However, as shown in FIG. 3, one may construct the device on a substrate 1 of amorphous silicon in which the dangling bonds are terminated by hydrogen, wherein the amorphous silicon forming the ordering region 1 is deposited on the amorphous silicon substrate 1 as a film 3, and there is formed the short range ordering region 2 in the form of stripes 4 extending in the film 3.

The width of the stripe 4 is preferably set at a value which induces a quantum effect. The width of the stripe of the short range ordering 1 and the short range ordering 2 may be 10–300 Å, preferably 20–100 Å. In these regions, the dangling bonds are preferably less than 5%.

EXPERIMENT 1

In the present experiment, the band gap and the photosensitivity (photocurrent Ip/dark current Id ratio) are measured as a function of the ratio H (=short range ordering 2/short range ordering 1) in the film that includes the short range ordering region 1 and the short range ordering region 2.

The ratio of the short range ordering region 2 to the short range ordering region 1 was measured by the high-resolution electron microscope and XMA. The condition of the deposition process is shown as follows:

$CO_2/SiH_4 = 2.5$–$10$
RF power: 0.05 W/cm$^2$–0.9 W/cm$^2$
substrate temperature: 250° C.
pressure: 0.1–2.5 Torr It was shown that the band gap increases with the ratio H while the photosensitivity decreases with the ratio H.

EXPERIMENT 2

In the present experiment, the size of the microscopic particle diameter in the film of the short range ordering region 1 was measured.

The condition of the deposition was set as follows:

| $CO_2/SiH_4 = 10$ | |
|---|---|
| RF power | 0.1/cm$^2$ |
| substrate temperature | 150–350° C. |
| pressure | 0.1–2.5 Torr |

The macroscopic size was measured using the high resolution electron microscope and XMA. The amount of Si-H in the film was also measured quantitatively. The relationship between particle diameter and a band gap, photosensitivity and the amount of SiH was obtained. The ratio H (short range ordering 2/short range ordering 1) of the two structures was fixed constant. Generally, it was shown that the amount of Si-H decreases with increasing size of the region 2.

EXPERIMENT 3

In the third experiment, the characteristics of a photosensor produced by using the photoconductor film as described in the first and second experiments are shown.

The device is constructed on a substrate 11 of a rigid material such as glass, and a Cr electrode 12 is deposited thereon. Further, an amorphous silicon layer 13 is deposited on the electrode 13 and a photoconductor film 14 according to the present invention is grown thereon. Further, a transparent electrode 15 is provided on the film 14. For the transparent electrode 15, $In_2O_3$ is used. The Cr electrode 12 and the transparent electrode 15 were formed by a vacuum deposition method. The amorphous silicon layer 13 and photoconductor film 14 shown in FIG. 1(D) were produced by the plasma CVD method. In the film 14, the short range ordering region 2 is formed like an island in the sea of short range ordering region 1. The ratio H (short range ordering 2/short range ordering 1) is set to 1.2. The macroscopic size of the particle diameter is 2000 Å. The following data show the characteristics of the photosensor obtained with this construction.

| S/N ratio | 30 dB (incident light strength is 100 lux) |
|---|---|
| response speed | 1.0 μsec |
| γ characteristic | 1.0 |

EXPERIMENT 4

In the fourth experiment, a photosensitive body is produced by using the photoconductor film having the construction as described in the first and second embodiments.

Figure 5:
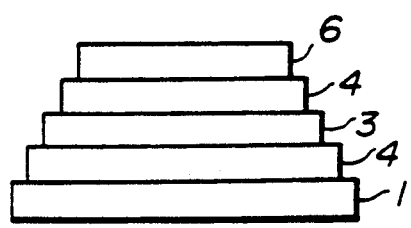
FIG. 5 is a diagram showing the construction of a photosensitive field of an electrophotograph wherein the photoconductor of the present invention is used.
Figure 6:
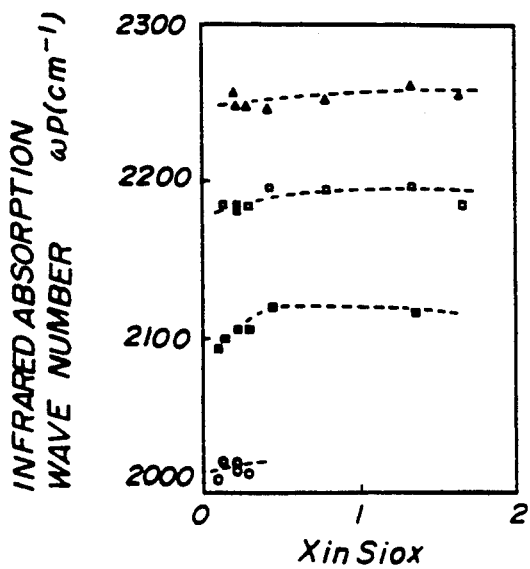
FIG. 6 is a graph showing the relationship between the wave number of infrared absorption in the structure of FIG. 1(D) as a function of the oxygen content.

FIG. 5 shows the layer construction of the photosensitive body. According to the illustrated construction, there is provided a substrate 21 at the bottom, and a photoconductor layer 22 is provided thereon. Further, an amorphous silicon layer 23 is grown on the layer 22, and a layer 24 having the composition identical with the layer 22 is formed on the layer 23. Further, a silicon nitride layer 25 is formed at the top. The layers 22 through 24 are formed by the plasma CVD method, while the silicon nitride layer 25 is formed by the sputtering. In the layer 22, the ratio H was set to 10, while the microscopic size of the short range ordering region 2 was 5000 Å. In the layer 24, on the other hand, the ratio H was set to enhance the photosensitivity. The macroscopic size of the short range ordering region 2 was 2000 Å.

The following data show the characteristics of the photosensitive body which has been produced with this construction.

| electrification potential | 500 V (the thickness of the film is 20 μm) |
|---|---|
| the half-reduced period of the electrification potential upon incident of a light | 20 sec (light of 100 lux) |
| dark attenuation | 0.75 (after 30 sec) |

EXPERIMENT 5

In the fifth experiment, the photoconductor of the present invention was used for a bipolar transistor. A current gain hfe of 50 was obtained. The ratio H was 3 and the microscopic particle diameter of the short range ordering region 2 was 3000 Å.

EXPERIMENT 6

In the sixth experiment, a PN junction diode was produced by using the photoconductor of the present invention. In this embodiment, the ratio H of the short range ordering region 2 to the short range ordering region 1 was set to 0.5. The microscopic size of particle diameter of the region 2 was 550 Å, and boron and phosphorus were used for doping to the P-type and N-type respectively. The density of the P=type dopant in the film was 0.1 at. %. The density of the N-type dopant was 0.05 at. %. A PN junction diode produced according to the above construction proved to be excellent, as demonstrated by the rectification ratio of 1.4.

EXPERIMENT 7

Figure 8:
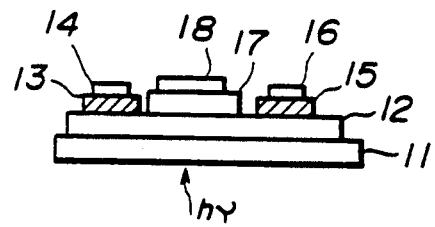
FIG. 8 is a diagram showing the cross-sectional view of a transistor using the photoconductor of the present invention.

In the seventh experiment, a phototransistor was produced by using the photoconductor of the present invention. The construction of the transistor is shown in FIG. 8. A glass plate was used for a substrate 31, and an active layer 32 having the ratio H of 1.2 was deposited on the substrate. The microscopic size of short range ordering region 2 was 8000 Å. On the layer 32, a source 33 and a drain 35, both having the ratio H of 0.5 and the macroscopic size of the short range ordering region 2 of 500 Å, were deposited. Boron was used as doping atoms, with the density of 1 at. %. On the source 33 and the drain 35, source electrode 34 and drain electrode 36 of Al were deposited. On the active layer 32, a gate insulating film 37 of $SiO_2$ was deposited by the sputtering method with a thickness of 1000 Å, and an Al electrode was deposited as a gate electrode 18. The light was introduced through the glass substrate while applying a voltage of 5 V across the source electrode 14 and drain electrode 16. When a light of 500 lux was introduced as an incident light, an Ip/Id ratio in the order of $10^3$ was obtained. By applying a gate voltage of 10 V, the photosensitivity can be adjusted from outside.

Further, the present invention is not limited to these embodiments, but various variations and modifications may be made without departing from the scope of the present invention.

What is claimed is:

1. A method for producing a photoconducting structure, said photoconducting structure including a photoconducting region of a first network of silicon and photocarrier producing regions of a second network of silicon, such that said photocarrier producing regions, each defined by a boundary, distribute in said photoconducting region and such that said second network is connected in conformity to said first network at said boundary without forming substantial dangling bonds, said method comprising the steps of:

introducing a first gaseous source material containing silicon into a reaction vessel held at a predetermined temperature and pressure;

releasing silicon in said reaction vessel as a result of decomposition of said first gaseous source material;

introducing a second gaseous source material containing an element that increases a band gap when incorporated into amorphous silicon, into said reaction vessel, said second gaseous source material releasing molecules of said element and byproduct gaseous molecules when dissociated;

applying energy to said second gaseous source material in said reaction vessel to cause a dissociation of said second gaseous source material such that the molecules of said element are released as a result of the dissociation;

depositing silicon and said element on a substrate to form an amorphous silicon layer that comprises isolated regions of amorphous silicon enriched with said element in a matrix of amorphous silicon;

said energy being set such that said molecules of said element are selectively released to form said photoconducting structure such that said photoconducting structure includes a photoconducting region of a first network of silicon and photocarrier producing regions of a second network of silicon, such that said photocarrier producing regions, each defined by a boundary, distribute in said photoconducting region and such that said second network is connected in conformity to said first network at said boundary without forming substantial dangling bonds.

2. A method as claimed in claim 1 in which said step of applying energy comprises a step of applying a plasma energy to said reaction vessel to cause the dissociation of the second gaseous source material.

3. A method as claimed in claim 1 in which said element comprises oxygen, said second gaseous source material comprises carbon dioxide, and said by-product gaseous molecules comprise carbon monoxide.

4. A method as claimed in claim 1 in which said element comprises nitrogen and said second gaseous source material comprises $NH_3$ and $NF_3$.

5. A method as claimed in claim 1 in which said element comprises carbon and said second gaseous source material comprises $CF_3$ and alcohol.

6. A method as claimed in claim 1 in which said element comprises oxygen and said second gaseous source material comprises $CO_2$, $N_2O$ and $SO_2$.

7. The method as claimed in claim 3, wherein said second gaseous source material is essentially comprised of carbon dioxide, wherein said energy is set to be in the range of $0.01-1.0$ W/cm$^3$.

8. The method as claimed in claim 7, wherein said second gaseous source material is supplied such that a total pressure in the range of $0.1-2.5$ Torr is realized in said reaction vessel.

* * * * *